US012696727B2

(12) United States Patent
Caron et al.

(10) Patent No.: US 12,696,727 B2
(45) Date of Patent: Jul. 28, 2026

(54) MANAGING SEMICONDUCTOR WAFER AND DIE HANDLING

(71) Applicant: Ciena Corporation, Hanover, MD (US)

(72) Inventors: Martin Caron, Québec (CA); Raphael Beaupré-Laflamme, Quebec (CA); Simon Savard, Quebec (CA)

(73) Assignee: Ciena Corporation, Hanover, MD (US)

( * ) Notice: Subject to any disclaimer, the term of this patent is extended or adjusted under 35 U.S.C. 154(b) by 363 days.

(21) Appl. No.: 18/411,788

(22) Filed: Jan. 12, 2024

(65) Prior Publication Data

US 2025/0233005 A1 Jul. 17, 2025

(51) Int. Cl.
*H10P 72/76* (2026.01)

(52) U.S. Cl.
CPC .................................... *H10P 72/76* (2026.01)

(58) Field of Classification Search
CPC .... H10P 72/7448; H10P 72/745; H10P 72/74; H10P 72/7412; H10P 72/744; H10P 72/7442; H10P 72/7604; H10P 72/7618; H10P 72/50; B25J 11/0095; B25J 15/065; Y10T 29/49998
See application file for complete search history.

(56) References Cited

U.S. PATENT DOCUMENTS 9,130,002 B2 * 9/2015 Frank .................. H10P 72/7624
11,772,280 B2 10/2023 Beaupré-Laflamme et al.

2001/0013684 A1 * 8/2001 Smedt ................. H10P 72/7608
118/503
2002/0066475 A1 * 6/2002 Verhaverbeke ..... H10P 72/7608
134/902

OTHER PUBLICATIONS

Elliot Wright Hawkes "Applying Dry Adhesives to the Real World", Stanford University, Department of Mechanical Engineering, 175 pages, Jun. 2015, Retreived at URL: http://purl.stanford.edu/jd262rc7265.
S. A. Suresh et al., "Spatially variant microstructured adhesive with one-way friction", J. R. Soc. Interface, vol. 16, pp. 1-8, Jan. 23, 2019, DOI: 10.1098/rsif.2018.0705.

(Continued)

*Primary Examiner* — Jason L Vaughan
*Assistant Examiner* — Amanda Kreiling
(74) *Attorney, Agent, or Firm* — Young Basile Hanlon & MacFarlane, P.C.

(57) ABSTRACT
An apparatus for securing a semiconductor wafer portion (SWP) comprises: a first rotatable structure (RS) configured to perform a first rotation and a first counterrotation about a first axis; a second RS configured to perform a second rotation and a second counterrotation about a second axis; a first set of one or more adjustable adhesive regions (AARs) located on the first RS and in contact with the SWP, where each AAR in the first set of AARs is configured to increase its adhesion to the SWP during the first rotation and to decrease its adhesion during the first counterrotation; and a second set of one or more AARs located on the second RS and in contact with the SWP, where each AAR in the second set of AARs is configured to increase its adhesion to the SWP during the second rotation and decrease its adhesion during the second counterrotation.

11 Claims, 10 Drawing Sheets

(56) References Cited

OTHER PUBLICATIONS

W. Wang et al., "Gecko-like dry adhesive surfaces and their applications: A review", Journal of Bionic Engineering, pp. 1011-1044, Oct. 6, 2021, DOI: 10.1007/s42235-021-00088-7.

Srinivasan A. Suresh "Engineering Gecko-Inspired Adhesives", Stanford University, Department of Mechanical Engineering, 179 pages, Mar. 2020, Retreived at URL: http://purl.stanford.edu/cp134gr3166.

\* cited by examiner

MANAGING SEMICONDUCTOR WAFER AND DIE HANDLING

TECHNICAL FIELD

This disclosure relates to managing semiconductor wafer and die handling.

BACKGROUND

Complementary metal-oxide-semiconductor (CMOS) processes and other fabrication techniques can be used to fabricate electronic integrated circuits that operate using electrical signals (e.g., voltage signals and/or current signals). Similar fabrication techniques can be used to fabricate photonic integrated circuits (PICs) in a silicon photonic platform or in other integrated photonic platforms. A silicon on insulator platform is an example of a silicon photonic platform that can be used to make opto-electrical active devices, optical passive devices, and optical waveguides in a silicon layer. In a silicon on insulator platform, the optical signals can be transmitted by optical waveguides and can be confined within the silicon layer, for example, because there is an underlying buried oxide (BOX) layer made up of thermal silicon dioxide (i.e., silicon oxidized using a thermal process) and an overlying silicon dioxide cladding surrounding the silicon layers. In such examples, the index contrast between the high index of refraction of silicon and the low index of refraction of silicon dioxide can be responsible for the confinement. Some advantages of silicon photonic platforms are the ability to make both active and passive devices, and the ability to make compact PICs due to the high index contrast between silicon and silicon dioxide.

SUMMARY

In one aspect, in general, an apparatus for securing a semiconductor wafer portion comprises: a first rotatable structure configured to perform a first rotation and a first counterrotation about a first axis; a second rotatable structure configured to perform a second rotation and a second counterrotation about a second axis; a first set of one or more adjustable adhesive regions located on the first rotatable structure and in contact with the semiconductor wafer portion, where each adjustable adhesive region in the first set of adjustable adhesive regions is configured to increase its adhesion to the semiconductor wafer portion during the first rotation and to decrease its adhesion to the semiconductor wafer portion during the first counterrotation; and a second set of one or more adjustable adhesive regions located on the second rotatable structure and in contact with the semiconductor wafer portion, where each adjustable adhesive region in the second set of adjustable adhesive regions is configured to increase its adhesion to the semiconductor wafer portion during the second rotation and decrease its adhesion to the semiconductor wafer portion during the second counterrotation.

Aspects can include one or more of the following features.

Where the first axis and the second axis are the same.

Where the first axis and the second axis are perpendicular to a flat surface of the semiconductor wafer portion.

Where the first set of adjustable adhesive regions and the second set of adjustable adhesive regions are arranged in a single plane.

Where the first set of adjustable adhesive regions are configured to collectively apply a first torque to the semiconductor wafer portion, and the second set of adjustable adhesive regions are configured to collectively apply a second torque that is substantially equal and opposite to the first torque.

Where the first set of adjustable adhesive regions are arranged in a first circle characterized by a first radius; and the second set of adjustable adhesive regions are arranged in a second circle that is concentric with the first circle and that is characterized by a second radius different from the first radius.

Where the first set of adjustable adhesive regions have a first total area that is equal to the sum of each area of the one or more adjustable adhesive regions in the first set of adjustable adhesive regions; the second set of adjustable adhesive regions have a second total area that is equal to the sum of each area of the one or more adjustable adhesive regions in the second set of adjustable adhesive regions; and a first ratio of (1) the first total area and (2) the second total area is substantially equal to a second ratio of (1) the second radius and (2) the first radius.

Where the first set of adjustable adhesive regions have a third total area that is equal to the sum of each area of the one or more adjustable adhesive regions in the first set of adjustable adhesive regions; the second set of adjustable adhesive regions have a fourth total area that is equal to the sum of each area of the one or more adjustable adhesive regions in the second set of adjustable adhesive regions; and the third total area and the fourth total area are determined based at least in part on respective locations of each adjustable adhesive region in the first set of adjustable adhesive regions and each adjustable adhesive region in the second set of adjustable adhesive regions.

The apparatus further comprises a rotation control element configured to apply a first force to the first rotatable structure and a second force to the second rotatable structure.

Where the rotation control element is configured to apply the first force to the first rotatable structure and the second force to the second rotatable structure by spatially translating the rotation control element along one dimension.

Where each adjustable adhesive region in the fourth set of one or more adjustable adhesive regions is configured to increase its adhesion to the semiconductor wafer portion during the fourth rotation and to decrease its adhesion to the semiconductor wafer portion during the fourth counterrotation.

In another aspect, in general, an apparatus for securing a semiconductor wafer portion comprises: a mounting structure configured to undergo expansion and contraction; adjustable adhesive regions located on the mounting structure and in contact with the semiconductor wafer portion, where each adjustable adhesive region is configured either to increase its adhesion to the semiconductor wafer portion during expansion of the mounting structure and decrease its adhesion to the semiconductor wafer portion during contraction of the mounting structure, or to decrease its adhesion to the semiconductor wafer portion during expansion of the mounting structure and increase its adhesion to the semiconductor wafer portion during contraction of the mounting structure.

Aspects can include one or more of the following features.

Where the adjustable adhesive regions are arranged in a plane and collectively apply no net force to the semiconductor wafer portion in the plane.

Where the mounting structure is configured to undergo expansion and contraction by either (1) undergoing a change in temperature of the mounting structure, or (2) undergoing a change in voltage across one or more portions of the mounting structure.

Where the mounting structure is composed of a piezo-electric material or a polymer.

Where the mounting structure is characterized by a coefficient of thermal expansion that is greater than 10 ppm/C.

In another aspect, in general, an apparatus for securing a semiconductor wafer portion comprises: a first linearly translatable structure configured to perform a first linear translation and a second linear translation opposite that of the first linear translation; a second linearly translatable structure configured to perform a third linear translation and a fourth linear translation opposite that of the third linear translation; a first set of one or more adjustable adhesive regions located on the first linearly translatable structure and in contact with the semiconductor wafer portion, where each adjustable adhesive region in the first set of adjustable adhesive regions is configured to increase its adhesion to the semiconductor wafer portion during the first linear translation and to decrease its adhesion to the semiconductor wafer portion during the second linear translation; and a second set of one or more adjustable adhesive regions located on the second linearly translatable structure and in contact with the semiconductor wafer portion, where each adjustable adhesive region in the second set of adjustable adhesive regions is configured to increase its adhesion to the semiconductor wafer portion during the third linear translation and to decrease its adhesion to the semiconductor wafer portion during the fourth linear translation; where the first linear translation and the third linear translation are parallel to each other, and at least a portion of the first set of adjustable adhesive regions and at least a portion of the second set of adjustable adhesive regions intersect a line perpendicular to the first linear translation and to the third linear translation.

Aspects can include one or more of the following features.

Where the first set of adjustable adhesive regions are configured to collectively apply a first torque to the semiconductor wafer portion, and the second set of adjustable adhesive regions are configured to collectively apply a second torque that is substantially equal and opposite to the first torque.

Where the first set of adjustable adhesive regions and the second set of adjustable adhesive regions are configured to collectively apply zero net linear force to the semiconductor wafer portion.

Where the first set of adjustable adhesive regions have a first total area that is equal to the sum of each area of the one or more adjustable adhesive regions in the first set of adjustable adhesive regions; the second set of adjustable adhesive regions have a second total area that is equal to the sum of each area of the one or more adjustable adhesive regions in the second set of adjustable adhesive regions; and the second total area is equal to the first total area. Aspects can have one or more of the following advantages.

The adjustable adhesive mounts (AAMs) disclosed herein can be utilized to increase the known good die yield of dies produced from semiconductor wafers. In general, AAMs can reduce manufacturing cost by improving the pickup, transport, manipulation, and storage of wafers, dies, and a variety of other components. For example, AAMs can be used to secure a wafer or die inside of a transport container, thereby improving its protection and allowing for the wafer or die to be transported between assembly lines or fabrication facilities.

In some examples, an AAM can allow for pickup and manipulation of objects by adhering to a portion of the object that may be smaller than other pickup methods. Furthermore, objects that are typically picked up using vacuum pickup tools may instead be picked up using an AAM, such that the challenges of maintaining vacuum during transport can be circumvented by using an AAM that does not rely upon actively maintaining vacuum. Since the adhering force of an AAM can be large relative to the area over which it is adhered to an object, it may also be used to pick up smaller objects or objects that do not offer much surface area for adhesion. AAMs can also be used to secure a wafer or die in a shipping box or on a test or assembly station (e.g., to install semiconductor optical amplifiers or transimpedance amplifiers on host chips). The adjustable adhesion provided by an AAM can be increased or decreased, depending on the application, and can be used to secure and later release an object without mechanical clamping.

Other features and advantages will become apparent from the following description, and from the figures and claims.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1:
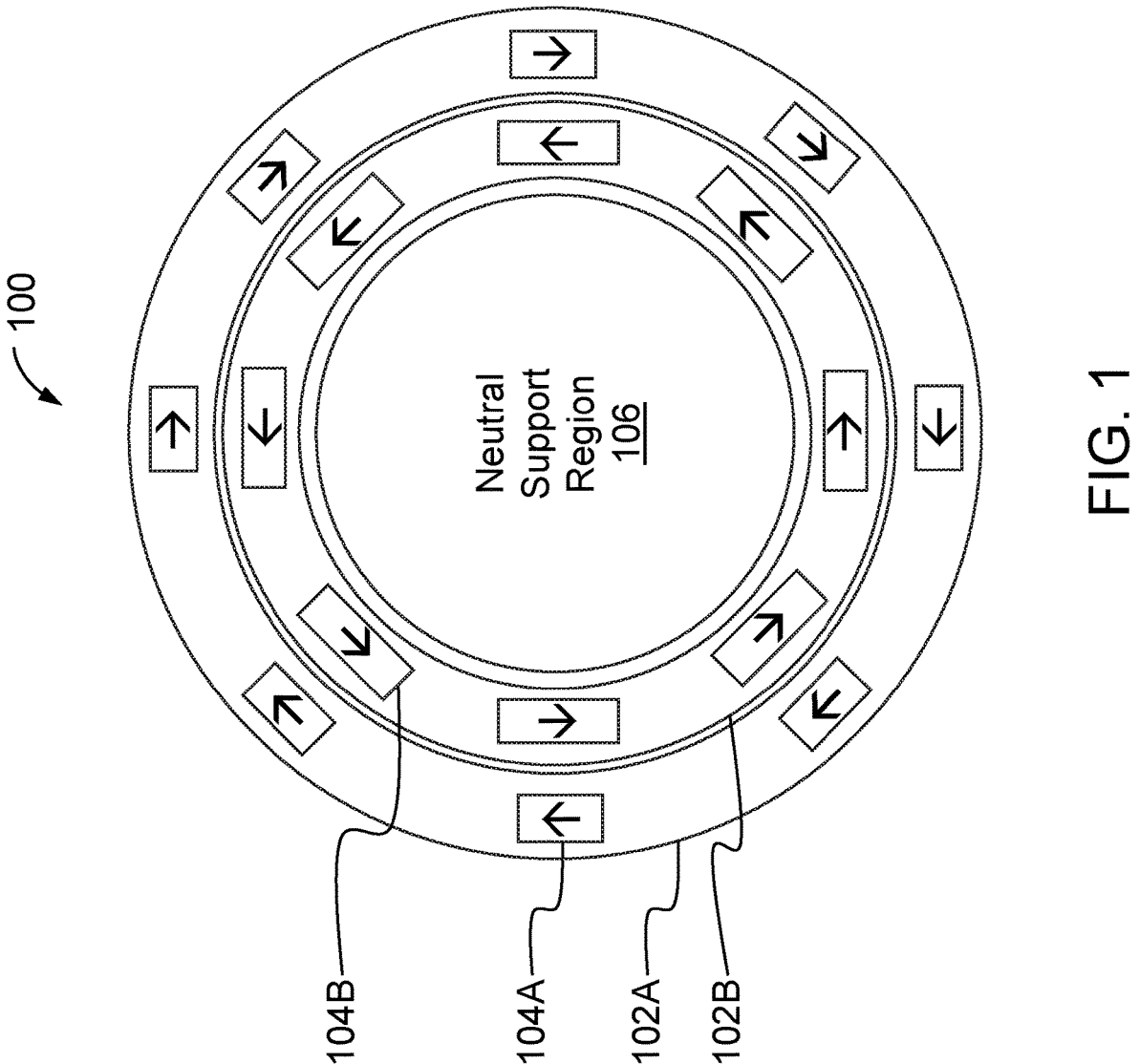
FIG. 1 is a schematic diagram of an example adjustable adhesive mount.

In general, a vacuum pickup tool can apply a vacuum to a portion of the top or bottom surface of a wafer, thereby securing the wafer to the vacuum pickup tool. In other examples, a clamping pickup tool can be used to grip the perimeter of a wafer, thereby securing the wafer to the clamping pickup tool. Vacuum pickup tools can require connection tubes (e.g., connected to a vacuum pump) and constant vacuum pumping (e.g., due to leaks), both of which can present mobility challenges for a wafer secured to a vacuum pickup tool. Both vacuum and clamping pickup tools may also induce stress in the wafers they are secured to (e.g., due to a low-pressure area generated by the vacuum pickup tool, or due to a clamping force applied by the clamping pickup tool).

The subject matter disclosed herein includes adjustable adhesive mounts (AAMs) that can be utilized for the pickup, transport, manipulation, and storage of wafers, dies, and a variety of other components. An AAM comprises adjustable adhesive regions (AARs) that can be used to secure an object to the AAM and to later release the object from the AAM. An AAR can be formed by coating a portion of a surface with a dry adhesive comprising setae, a plurality of structures similar to bristle- or hair-like structures found in biology. Dry adhesives can be repeatedly adhered to and released from a surface and are similar in some ways to the foot structure of geckos, an animal that is particularly suited for climbing.

In general, setae forming a dry adhesive may be formed from carbon nanotubes or other small structures. In some examples, the dry adhesive can be configured such that the lateral movement of the setae increases the contact area between the setae and an object to be picked up, thus increasing the adhesion (e.g., by increasing the van der Waals force) between the dry adhesive and the object. Lateral movement of the setae in the opposite direction can release the picked-up object by reducing the contact area between the setae and the object. Thus, the adhesion of an AAM can be tunable (i.e., varying in the amount of force applied) and anisotropic (i.e., movement in a first direction results in a different amount of adhesion being applied compared to movement in a second direction opposite to that of the first direction). During pick up the setae are loaded (i.e., their contact area with the object increases) while during release the setae are unloaded (i.e., their contact area with the object decreases). The setae can be formed to have various shapes and patterns so as to enable and enhance pick up and release of objects.

In contrast to leakage that may occur in vacuum pickup tools, which can result in a decrease of force over time, AAMs can be active for long periods of time (e.g., hours, days, or weeks of time) without additional vacuum, electricity, or external force being applied. Additionally, the adhesion provided by AAMs can be exceptionally strong in some examples. For example, the pickup of a 500 μm thickness silicon wafer with an AAM can be accomplished using a surface area of the AARs in contact with the silicon wafer that is on the order of 1% of the surface area of the silicon wafer. In some example AAMs, the nonzero length of the setae can accommodate a wider variety of surface topography and warpage. In general, various geometries and movements can be utilized by AAMs.

FIG. 1 shows an example AAM 100 comprising a first rotatable structure 102A and a second rotatable structure 102B. In this example, the first rotatable structure 102A and the second rotatable structure 102B are concentric annuli and are arranged such that the inner radius of the first rotatable structure 102A is greater than the outer radius of the second rotatable structure 102B. A first set of AARs 104A are located on top of the first rotatable structure 102A and a second set of AARs 104B are located on top of the second rotatable structure 102B. Adhesion is activated and deactivated by rotating the first rotatable structure 102A and the second rotatable structure 102B in opposite directions (i.e., such that they are counter-rotating with respect to one another). The shear stress applied on the AARs generates adhesion in the normal direction (i.e., out of the page). This adhesion can be exploited to anchor the AAM 100 onto a surface, or to pick up objects, such as wafers and dies. The adhesion can be sustained indefinitely, until a sufficient force is applied in a proper lateral direction so as to result in unloading. In this example, unloading can be achieved by counter-rotating the first rotatable structure 102A and the second rotatable structure 102B relative to their rotations during loading. The AAM 100 further comprises a neutral support region 106 that does not have any AARs located on top of it.

Referring again to FIG. 1, each AAR in the first set of AARs 104A and its nearest neighboring AAR in the second set of AARS 104B have opposite orientations of setae (indicated by arrows) so as to have opposing shear stresses during loading. A first collective shear force applied by the first set of AARs 104A during rotation of the first rotatable structure 102A and a second collective shear force applied by the second set of AARs 104B during rotation of the second rotatable structure 102B result in opposing torques applied to a surface or to an object to be secured that is in contact with and adhered to all of the AARs. In some examples, the opposing torques are equal and opposite, thereby resulting in zero net torque and zero net linear force applied to the surface or the object to be secured by the AAM 100. The shear force provided by each AAR, in general, can depend on the adhesive material (e.g., the pattern and shape of setae, as well as their chemical composition) and the amount of contact area of each AAR with the object to be secured. If the AARs are composed of a dry adhesive, the amount of contact area of each AAR with the object to be secured varies during loading and unloading of the setae of the dry adhesive.

Referring again to FIG. 1, in some examples, the AARs can all be composed of the same dry adhesive, and thus provide similar shear stresses (i.e., similar shear forces per unit area of each AAR). In such examples, a first total area that is equal to the sum of each area of AARs in the first set of AARs 104A and a second total area that is equal to the sum of each area of AARs in the second set of AARs 104B can be determined based at least in part on respective locations of each AAR. Conversely, the respective locations of each AAR can be determined based at least in part on the first total area and the second total area. The location of each AAR can include information regarding its radial distance from an axis (e.g., an axis passing through the center of and perpendicular to a flat surface of the AAM or of the object to be secured). In general, the torque about an axis is equal to the cross product of force and the radial distance at which the force is applied, such that the torque applied by each AAR can depend on the radial distance of the AAR from the axis and the area of the AAR, on which the shear force applied depends. Since the maximum shear force applied by an AAR depends on the area of the AAR, AARs that are not fully loaded (i.e., with less than maximal area of the AAR in contact with the object to be secured) may occupy more area than is desired. In such examples, the area of the AAR may be reduced such that the AAR can apply the desired amount of shear force when fully loaded. In some examples, the object to be secured by the AAM 100 may only be able to withstand a shear stress that is below a certain value, where shear stress is equal to shear force divided by the area over which it is applied.

Figure 2:
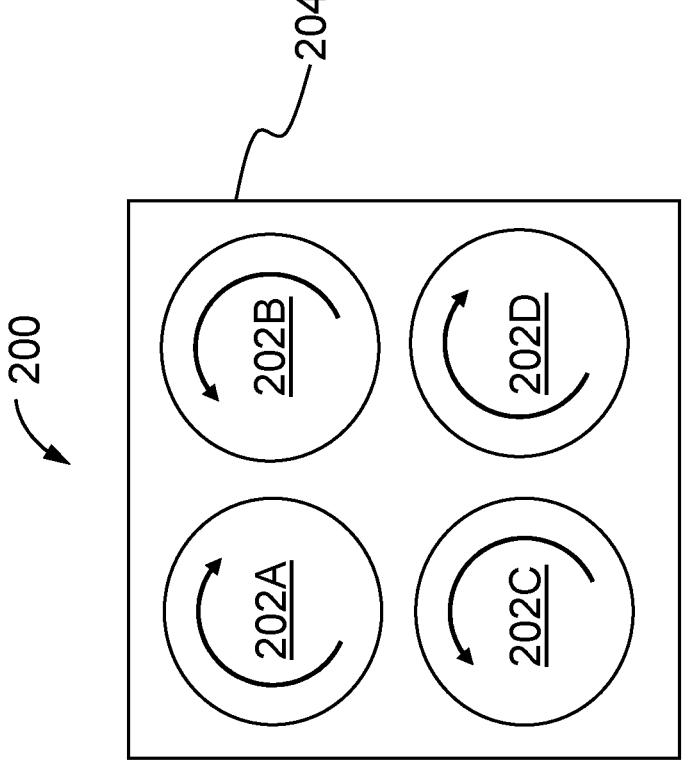
FIG. 2 is a schematic diagram of an example adjustable adhesive mount.

FIG. 2 shows an example AAM 200 during loading of setae located on four discs, where the AAM 200 comprises a first disc 202A rotating in a first direction (clockwise), a second disc 202B rotating in a second direction (counter-clockwise), a third disc 202C rotating in the second direction (counter-clockwise), and a fourth disc 202D rotating in the first direction (clockwise), each in contact with a mounting surface 204 (e.g., of an object in the process of being picked up by the AAM 200). Thus, half of the discs are rotating clockwise, while the other half are rotating counter-clockwise. In general, the number of discs and their respective areas can vary while maintaining zero net torque applied about a desired axis and zero net linear force.

FIGS. 3, 4, 5 and 6 show example AAMs comprising two or more linearly translatable AARs. The AAMs can be designed such that they apply zero net torque as well as zero net linear force to an object being secured (i.e., no rotational or linear translation is performed by the AAMs to the object).

Figure 3:
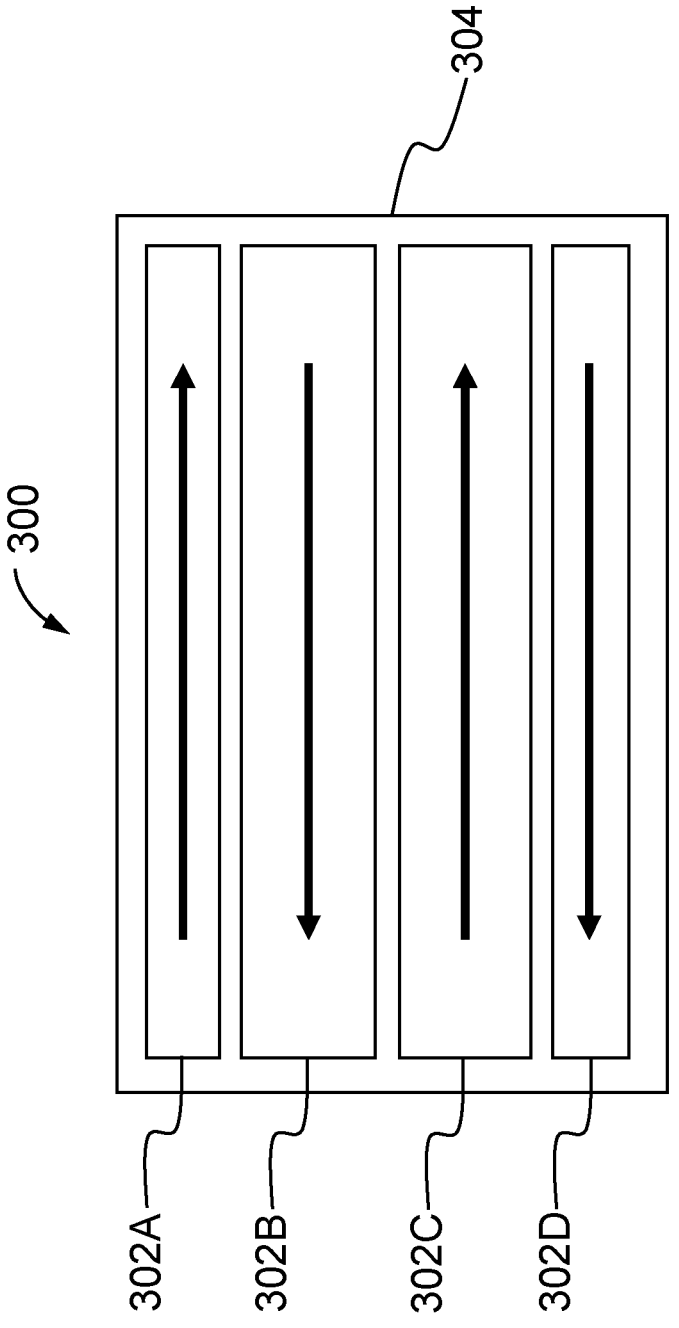
FIG. 3 is a schematic diagram of an example adjustable adhesive mount.

FIG. 3 shows an example AAM 300 during loading of setae located on four AARs, where the AAM 300 comprises a first AAR 302A applying a first shear force to the right, a second AAR 302B applying a second shear force to the left, a third AAR 302C applying a third shear force to the right, and a fourth AAR 302D applying a fourth shear force to the left, where each AAR is rectangular in shape and is in contact with a mounting surface 304. In order to apply zero net torque and zero net linear force to the mounting surface 304, the first shear force and the fourth shear force can be equal to each other and less than second shear force and the third shear force, which can be equal to each other. The different shear forces applied can be implemented, for example, by loading the AARs differently using different ranges of motion of each AAR, by using different areas of the AARs, as in this example, or by using different dry adhesives.

Figure 4:
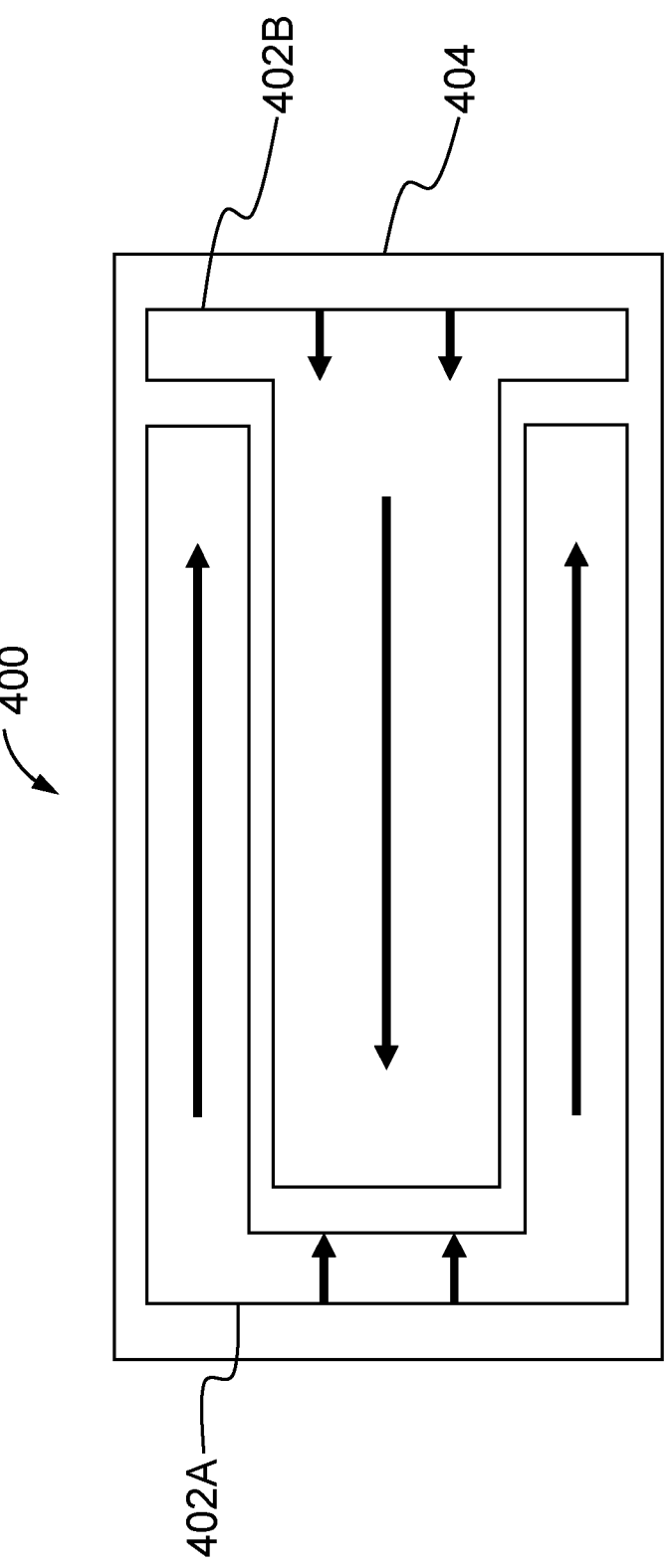
FIG. 4 is a schematic diagram of an example adjustable adhesive mount.

FIG. 4 shows an example AAM 400 during loading of setae located on two AARs, where the AAM 400 comprises a first AAR 402A and a second AAR 402B that are inter-locking shapes and that are in contact with a mounting surface 404. In some examples, such as when the first AAR 402A and the second AAR 402B are composed of similar dry adhesives, the area of the first AAR 402A and the area of the second AAR 402B can be equal, such that they apply zero net torque and zero net linear force to the mounting surface 404. In such examples, the precise shapes of the AARs can influence the net torque and net linear force, and thus can be considered during design of the AAM 400.

Figure 5:
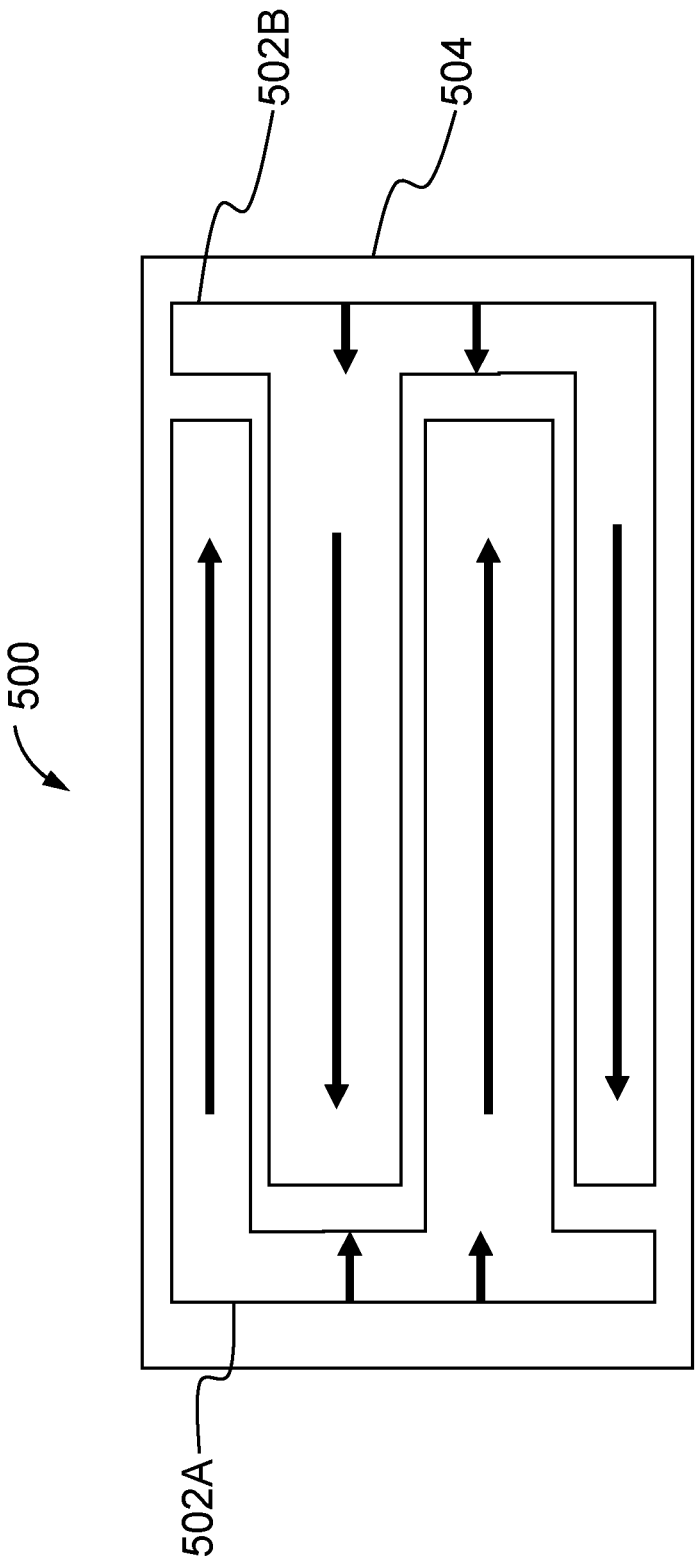
FIG. 5 is a schematic diagram of an example adjustable adhesive mount.

FIG. 5 shows an example AAM 500 during loading of setae located on two AARs, where the AAM 500 comprises a first AAR 502A and a second AAR 502B that are inter-locking shapes and that are in contact with a mounting surface 504. In some examples, such as when the first AAR 502A and the second AAR 502B are composed of similar dry adhesives, the area of the first AAR 502A and the area of the second AAR 502B can be equal, such that they apply zero net torque and zero net linear force to the mounting surface 504. In such examples, the precise shapes of the AARs can influence the net torque and net linear force, and thus can be considered during design of the AAM 500.

Figure 6:
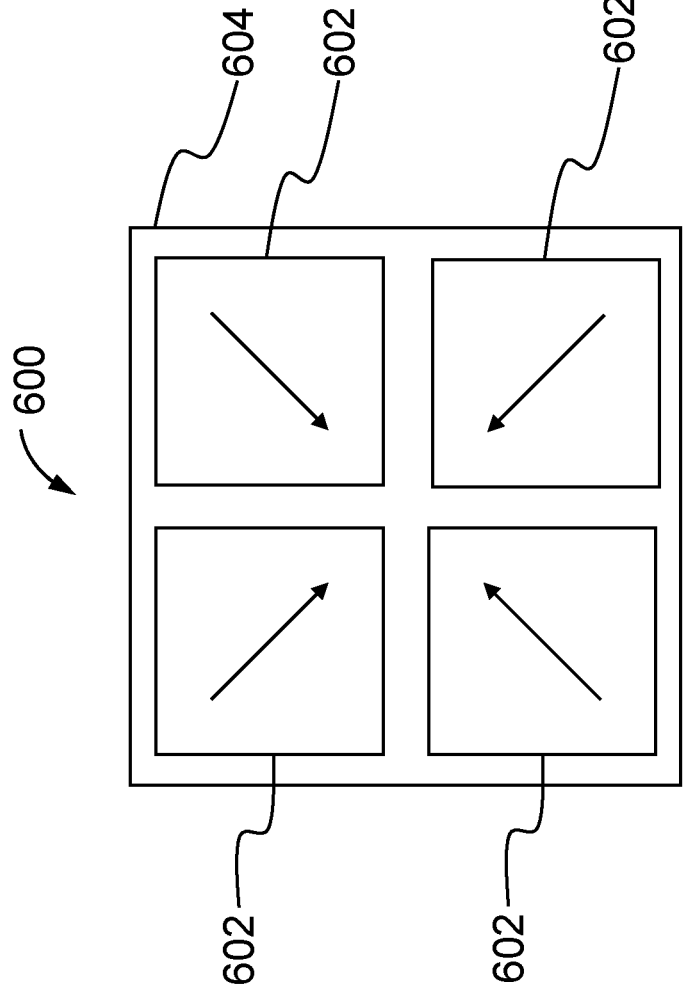
FIG. 6 is a schematic diagram of an example adjustable adhesive mount.

FIG. 6 shows an example AAM 600 during loading of setae located on four AARs 602 each in contact with a mounting surface 604. The motion of each AAR 602 is along a radial direction of the center of the mounting surface 604, such that each AAR 602 does not apply torque to the mounting surface 604. However, each AAR 602 applies a linear force, and the AARs 602 collectively apply zero net linear force and zero net torque.

Figure 7:
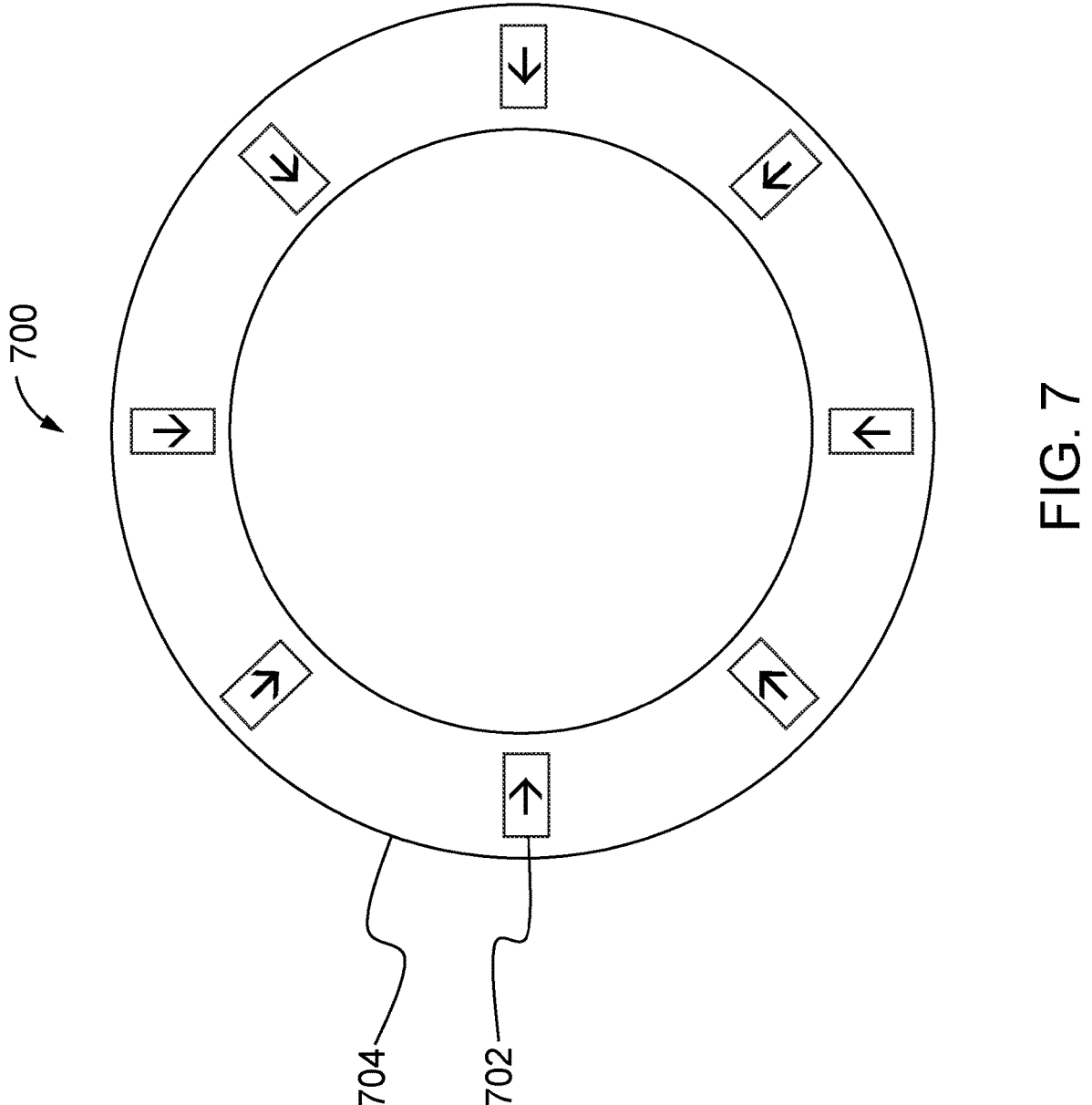
FIG. 7 is a schematic diagram of an example adjustable adhesive mount.

FIG. 7 shows an example AAM 700 during loading of setae located on AARs 702 that are on top of a mounting structure 704 which has an annular shape. Since the setae of the AARs 702 can be loaded and unloaded by relatively small movements, the mounting structure 704 can be designed such that it can undergo expansion and contraction so as to load and unload the AARs 702. In some examples, the mounting structure 704 can be composed of a piezo-electric material, such that the mounting structure 704 undergoes an expansion or a contraction when a change in voltage across one or more portions of the mounting structure 704 occurs. In other examples, the mounting structure 704 can be composed of a material with a high coefficient of thermal expansion (CTE), such as a polymer (e.g., polyeth-ylene or polyesther). In such examples, the mounting struc-ture 704 undergoes an expansion or a contraction when it changes temperature (e.g., by an amount on the order of 10-100° C.). For example, silicon may have a CTE of approximately 3 ppm/° C., while the mounting structure 704 may have a CTE greater than or equal to 10 ppm/° C. (e.g., 25 ppm/° C.). In some examples, loading of the setae may occur when the setae are displaced by approximately 100 μm or more (e.g., 200 μm), for example by applying a change in temperature to the mounting structure 704 that is approxi-mately greater than 10° C.

Referring again to FIG. 7, the adhesion of the AARs 702 to an object can be of a "set and forget" nature (e.g., requiring an applied voltage to the mounting structure 704 or an applied temperature change of the mounting structure 704 so as to effect unloading of the setae), such that an accidental release of the AAM 700 from the object is unlikely. For example, release of the object may be accomplished in some examples by performing a rapid heating of the mounting structure 704 while the object being adhered to remains at a relatively stable temperature, which may be assisted by low thermal conductivity across the setae of the AARs 702.

Figure 8A:
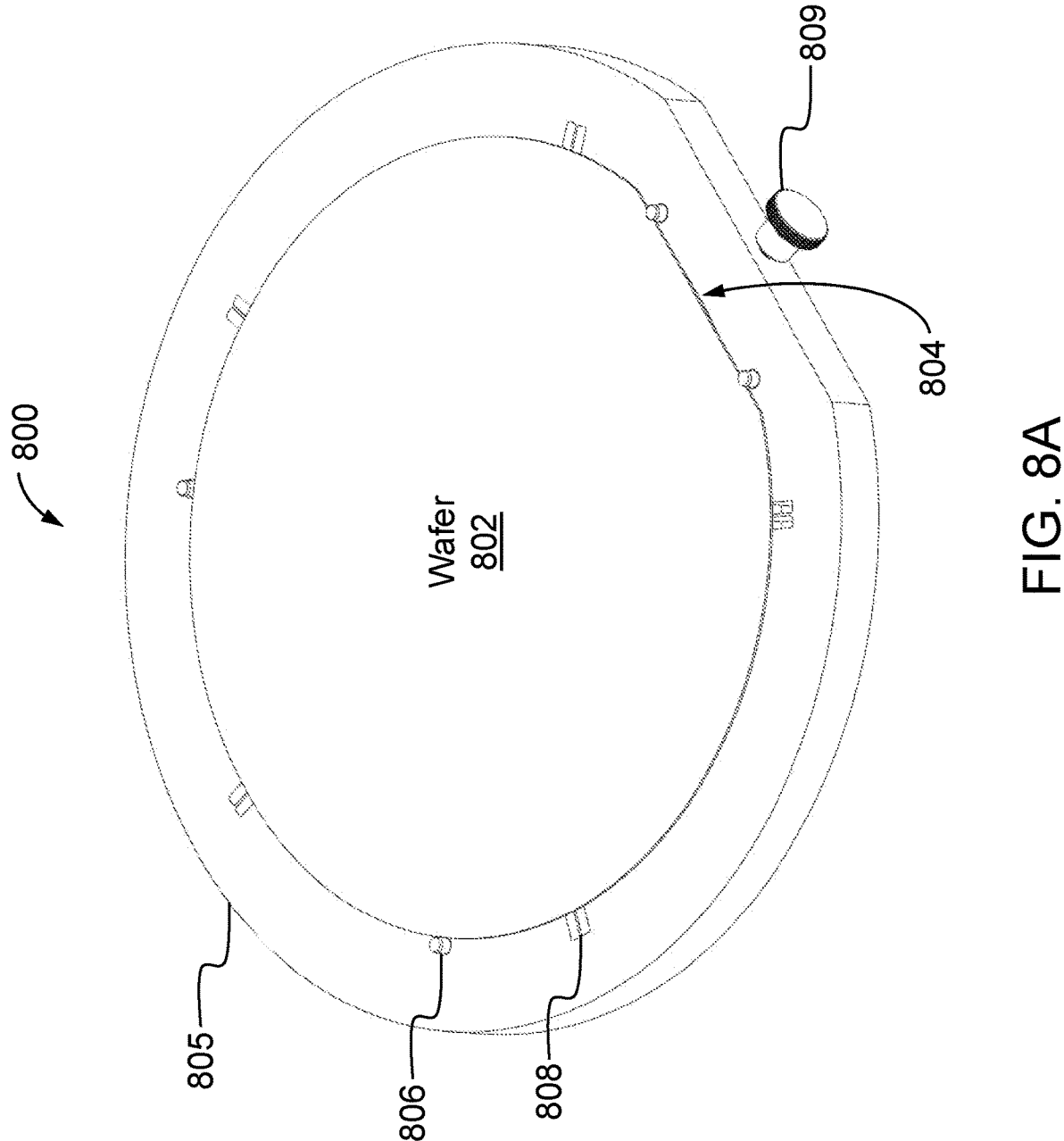
FIG. 8A is a schematic diagram of an example adjustable adhesive mount.
Figure 8B:
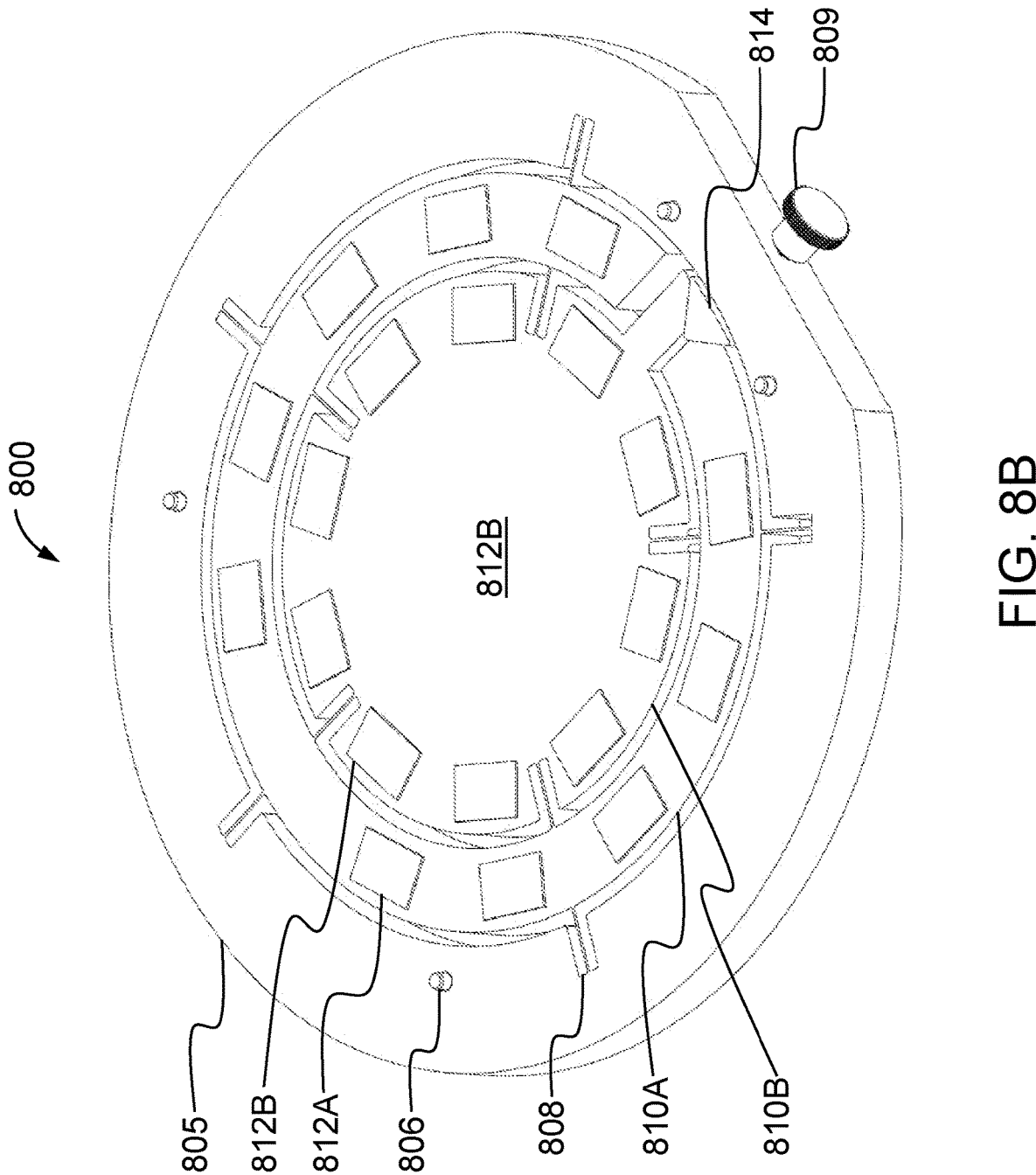
FIG. 8B is a schematic diagram of an example adjustable adhesive mount.
Figure 8C:
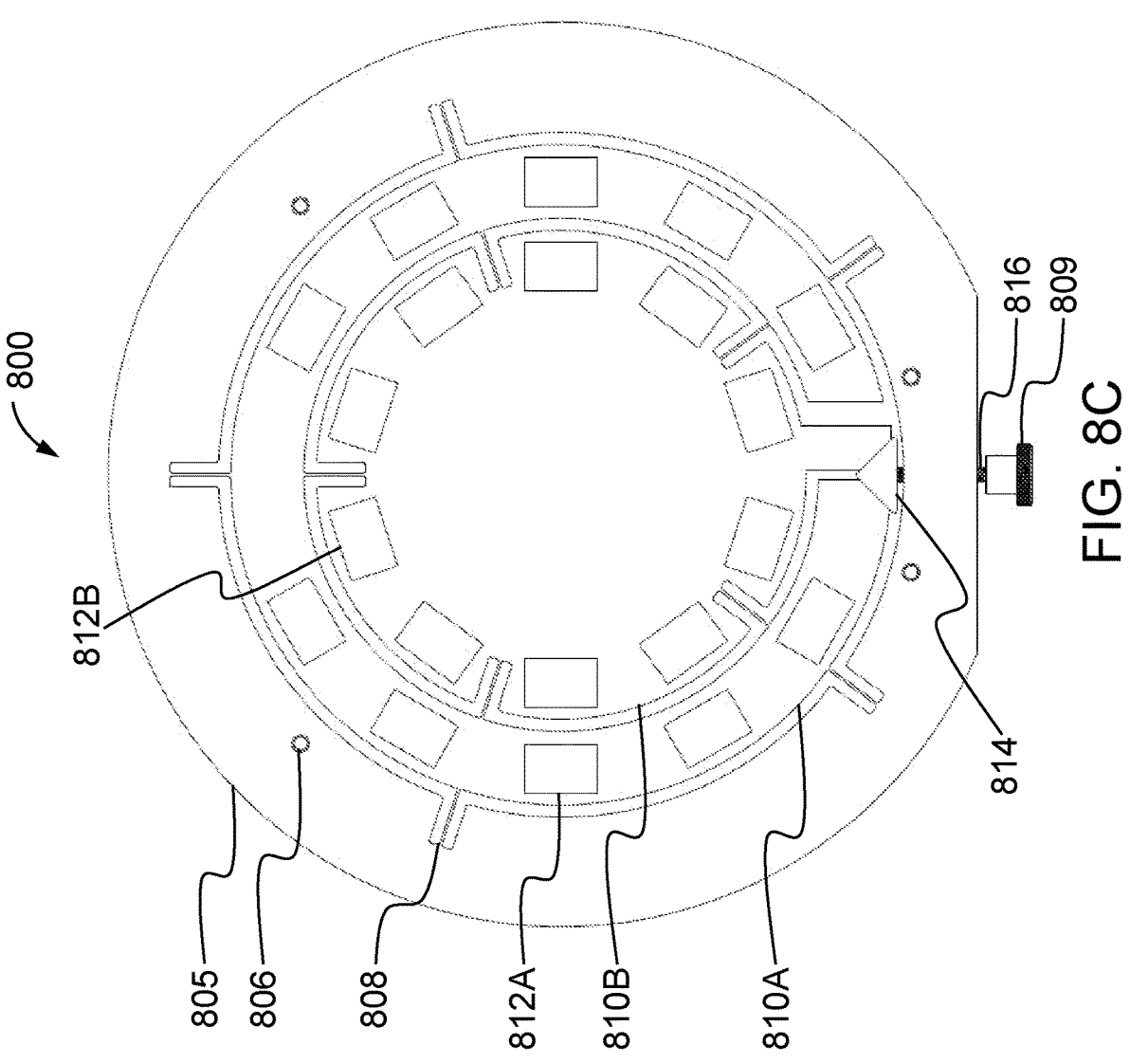
FIG. 8C is a schematic diagram of an example adjustable adhesive mount.

FIGS. 8A, 8B, and 8C and show various views of an example AAM 800 that is compatible with current manu-facturing techniques.

FIG. 8A shows an oblique view of the AAM 800 securing a wafer 802 (e.g., a 12-inch wafer) that has a flat alignment feature 804. The AAM 800 comprises a perimeter structure 805, four dowel pins 806 that can assist with alignment, and five sets of flexure bearings 808 that are characterized by a restoring force when deformed from their equilibrium posi-tions. A knob 809 (i.e., a rotation control element) is used for loading and unloading of setae (not shown). In some examples, a rotation control element can effect rotation of the a first rotatable structure and a second rotatable structure by applying a first force to the first rotatable structure and a second force to the second rotatable structure (e.g., by spatially translating or rotating the rotation control element). In this example, the knob 809 accomplishes rotation control by being screwed into or out of the perimeter structure 805. In some examples, rotation control may be performed by a mechanical motor or by a piezoelectric effect.

FIG. 8B shows an oblique view of the AAM 800 without the wafer 802 in place. The AAM 800B comprises a first rotatable structure 810A and a second rotatable structure 810B that are concentric with one another. A first set of AARs 812A are located on top of the first rotatable structure 810A and a second set of AARs 812B are located on top of the second rotatable structure 810B. Each AAR in the first set of AARs 812A and its nearest neighboring AAR in the second set of AARS 812B have opposite orientations of setae so as to have opposing shear stresses during loading. Adhesion is activated and deactivated by rotating the first rotatable structure 810A and the second rotatable structure 810B in opposite directions (i.e., such that they are counter-rotating with respect to one another). The knob 809 spatially translates a wedge 814 by screwing a threaded rod (not shown) inside of the perimeter structure 805, thereby per-forming loading and unloading of the setae of the AARs by inducing a relative motion between the first rotatable struc-ture 810A and the second rotatable structure 810B. The flexure bearings 808 provide angular flexibility for a range of movement and a spring action that maintains contact between the first rotatable structure 810A and the wedge 814, as well as between the second rotatable structure 810B and the wedge 814.

FIG. 8C shows a top view of the AAM 800 without the wafer in place. The knob 809 spatially translates the wedge 814 by screwing a threaded rod 816 inside of the perimeter structure 805, thereby performing loading and unloading of the setae of the AARs by inducing a relative motion between the first rotatable structure 810A and the second rotatable structure 810B.

In one aspect, in general, an apparatus for securing a semiconductor wafer portion comprises: a first rotatable structure configured to perform a first rotation and a first counterrotation about a first axis; a second rotatable structure configured to perform a second rotation and a second counterrotation about a second axis; a first set of one or more adjustable adhesive regions located on the first rotatable structure and in contact with the semiconductor wafer portion, where each adjustable adhesive region in the first set of adjustable adhesive regions is configured to increase its adhesion to the semiconductor wafer portion during the first rotation and to decrease its adhesion to the semiconductor wafer portion during the first counterrotation; and a second set of one or more adjustable adhesive regions located on the second rotatable structure and in contact with the semiconductor wafer portion, where each adjustable adhesive region in the second set of adjustable adhesive regions is configured to increase its adhesion to the semiconductor wafer portion during the second rotation and decrease its adhesion to the semiconductor wafer portion during the second counterrotation.

Aspects can include one or more of the following features.

Where the first axis and the second axis are the same.

Where the first axis and the second axis are perpendicular to a flat surface of the semiconductor wafer portion.

Where the first set of adjustable adhesive regions and the second set of adjustable adhesive regions are arranged in a single plane.

Where the first set of adjustable adhesive regions are configured to collectively apply a first torque to the semiconductor wafer portion, and the second set of adjustable adhesive regions are configured to collectively apply a second torque that is substantially equal and opposite to the first torque.

Where the first set of adjustable adhesive regions are arranged in a first circle characterized by a first radius; and the second set of adjustable adhesive regions are arranged in a second circle that is concentric with the first circle and that is characterized by a second radius different from the first radius.

Where the first set of adjustable adhesive regions have a first total area that is equal to the sum of each area of the one or more adjustable adhesive regions in the first set of adjustable adhesive regions; the second set of adjustable adhesive regions have a second total area that is equal to the sum of each area of the one or more adjustable adhesive regions in the second set of adjustable adhesive regions; and a first ratio of (1) the first total area and (2) the second total area is substantially equal to a second ratio of (1) the second radius and (2) the first radius.

Where the first set of adjustable adhesive regions have a third total area that is equal to the sum of each area of the one or more adjustable adhesive regions in the first set of adjustable adhesive regions; the second set of adjustable adhesive regions have a fourth total area that is equal to the sum of each area of the one or more adjustable adhesive regions in the second set of adjustable adhesive regions; and the third total area and the fourth total area are determined based at least in part on respective locations of each adjustable adhesive region in the first set of adjustable adhesive regions and each adjustable adhesive region in the second set of adjustable adhesive regions.

The apparatus further comprises a rotation control element configured to apply a first force to the first rotatable structure and a second force to the second rotatable structure.

Where the rotation control element is configured to apply the first force to the first rotatable structure and the second force to the second rotatable structure by spatially translating the rotation control element along one dimension.

Where each adjustable adhesive region in the fourth set of one or more adjustable adhesive regions is configured to increase its adhesion to the semiconductor wafer portion during the fourth rotation and to decrease its adhesion to the semiconductor wafer portion during the fourth counterrotation.

In another aspect, in general, an apparatus for securing a semiconductor wafer portion comprises: a mounting structure configured to undergo expansion and contraction; adjustable adhesive regions located on the mounting structure and in contact with the semiconductor wafer portion, where each adjustable adhesive region is configured either to increase its adhesion to the semiconductor wafer portion during expansion of the mounting structure and decrease its adhesion to the semiconductor wafer portion during contraction of the mounting structure, or to decrease its adhesion to the semiconductor wafer portion during expansion of the mounting structure and increase its adhesion to the semiconductor wafer portion during contraction of the mounting structure.

Aspects can include one or more of the following features.

Where the adjustable adhesive regions are arranged in a plane and collectively apply no net force to the semiconductor wafer portion in the plane.

Where the mounting structure is configured to undergo expansion and contraction by either (1) undergoing a change in temperature of the mounting structure, or (2) undergoing a change in voltage across one or more portions of the mounting structure.

Where the mounting structure is composed of a piezoelectric material or a polymer.

Where the mounting structure is characterized by a coefficient of thermal expansion that is greater than 10 ppm/C.

In another aspect, in general, an apparatus for securing a semiconductor wafer portion comprises: a first linearly translatable structure configured to perform a first linear translation and a second linear translation opposite that of the first linear translation; a second linearly translatable structure configured to perform a third linear translation and a fourth linear translation opposite that of the third linear translation; a first set of one or more adjustable adhesive regions located on the first linearly translatable structure and in contact with the semiconductor wafer portion, where each adjustable adhesive region in the first set of adjustable adhesive regions is configured to increase its adhesion to the semiconductor wafer portion during the first linear translation and to decrease its adhesion to the semiconductor wafer portion during the second linear translation; and a second set of one or more adjustable adhesive regions located on the second linearly translatable structure and in contact with the semiconductor wafer portion, where each adjustable adhesive region in the second set of adjustable adhesive regions is configured to increase its adhesion to the semiconductor wafer portion during the third linear translation and to decrease its adhesion to the semiconductor wafer portion during the fourth linear translation; where the first linear translation and the third linear translation are parallel to each other, and at least a portion of the first set of adjustable adhesive regions and at least a portion of the second set of adjustable adhesive regions intersect a line perpendicular to the first linear translation and to the third linear translation.

Aspects can include one or more of the following features.

Where the first set of adjustable adhesive regions are configured to collectively apply a first torque to the semiconductor wafer portion, and the second set of adjustable adhesive regions are configured to collectively apply a second torque that is substantially equal and opposite to the first torque.

Where the first set of adjustable adhesive regions and the second set of adjustable adhesive regions are configured to collectively apply zero net linear force to the semiconductor wafer portion.

Where the first set of adjustable adhesive regions have a first total area that is equal to the sum of each area of the one or more adjustable adhesive regions in the first set of adjustable adhesive regions; the second set of adjustable adhesive regions have a second total area that is equal to the sum of each area of the one or more adjustable adhesive regions in the second set of adjustable adhesive regions; and the second total area is equal to the first total area.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An apparatus for securing a semiconductor wafer portion, the apparatus comprising:
   a first rotatable structure configured to perform a first rotation and a first counterrotation about a first axis;
   a second rotatable structure configured to perform a second rotation and a second counterrotation about a second axis;
   a first set of one or more adjustable adhesive regions located on the first rotatable structure and in contact with the semiconductor wafer portion, where each adjustable adhesive region in the first set of adjustable adhesive regions is configured to increase its adhesion to the semiconductor wafer portion during the first rotation and to decrease its adhesion to the semiconductor wafer portion during the first counterrotation; and
   a second set of one or more adjustable adhesive regions located on the second rotatable structure and in contact with the semiconductor wafer portion, where each adjustable adhesive region in the second set of adjustable adhesive regions is configured to increase its adhesion to the semiconductor wafer portion during the second rotation and decrease its adhesion to the semiconductor wafer portion during the second counterrotation.

2. The apparatus of claim 1, where the first axis and the second axis are the same.

3. The apparatus of claim 1, where the first axis and the second axis are perpendicular to a flat surface of the semiconductor wafer portion.

4. The apparatus of claim 1, where the first set of adjustable adhesive regions and the second set of adjustable adhesive regions are arranged in a single plane.

5. The apparatus of claim 1, where the first set of adjustable adhesive regions are configured to collectively apply a first torque to the semiconductor wafer portion, and the second set of adjustable adhesive regions are configured to collectively apply a second torque that is substantially equal and opposite to the first torque.

6. The apparatus of claim 1, where
   the first set of adjustable adhesive regions are arranged in a first circle characterized by a first radius; and
   the second set of adjustable adhesive regions are arranged in a second circle that is concentric with the first circle and that is characterized by a second radius different from the first radius.

7. The apparatus of claim 6, where
   the first set of adjustable adhesive regions have a first total area that is equal to a sum of each area of the one or more adjustable adhesive regions in the first set of adjustable adhesive regions;
   the second set of adjustable adhesive regions have a second total area that is equal to a sum of each area of the one or more adjustable adhesive regions in the second set of adjustable adhesive regions; and
   a first ratio of (1) the first total area and (2) the second total area is substantially equal to a second ratio of (1) the second radius and (2) the first radius.

8. The apparatus of claim 1, where
   the first set of adjustable adhesive regions have a third total area that is equal to a sum of each area of the one or more adjustable adhesive regions in the first set of adjustable adhesive regions;
   the second set of adjustable adhesive regions have a fourth total area that is equal to a sum of each area of the one or more adjustable adhesive regions in the second set of adjustable adhesive regions; and
   the third total area and the fourth total area are determined based at least in part on respective locations of each adjustable adhesive region in the first set of adjustable adhesive regions and each adjustable adhesive region in the second set of adjustable adhesive regions.

9. The apparatus of claim 1, further comprising a rotation control element configured to apply a first force to the first rotatable structure and a second force to the second rotatable structure.

10. The apparatus of claim 9, where the rotation control element is configured to apply the first force to the first rotatable structure and the second force to the second rotatable structure by spatially translating the rotation control element along one dimension.

11. The apparatus of claim 1, further comprising
   a third rotatable structure configured to perform a third rotation and a third counterrotation about a third axis;
   a fourth rotatable structure configured to perform a fourth rotation and a fourth counterrotation about a fourth axis;
   a third set of one or more adjustable adhesive regions located on the third rotatable structure and in contact with the semiconductor wafer portion, where each adjustable adhesive region in the third set of one or more adjustable adhesive regions is configured to increase its adhesion to the semiconductor wafer portion during the third rotation and to decrease its adhesion to the semiconductor wafer portion during the third counterrotation; and a fourth set of one or more adjustable adhesive regions located on the fourth rotatable structure and in contact with the semiconductor wafer portion, where each adjustable adhesive region in the fourth set of one or more adjustable adhesive regions is configured to increase its adhesion to the semiconductor wafer portion during the fourth rotation and to decrease its adhesion to the semiconductor wafer portion during the fourth counterrotation.

\* \* \* \* \*